United States Patent
Gershon et al.

(10) Patent No.: US 11,233,161 B2
(45) Date of Patent: Jan. 25, 2022

(54) FOCUSED ENERGY PHOTOVOLTAIC CELL

(71) Applicant: INTERNATIONAL BUSINESS MACHINES CORPORATION, Armonk, NY (US)

(72) Inventors: Talia S. Gershon, White Plains, NY (US); Ning Li, White Plains, NY (US); Devendra K. Sadana, Pleasantville, NY (US); Ghavam G. Shahidi, Pound Ridge, NY (US)

(73) Assignee: International Business Machines Corporation, Armonk, NY (US)

( * ) Notice: Subject to any disclaimer, the term of this patent is extended or adjusted under 35 U.S.C. 154(b) by 69 days.

(21) Appl. No.: 16/697,479

(22) Filed: Nov. 27, 2019

(65) Prior Publication Data

US 2020/0098937 A1 Mar. 26, 2020

Related U.S. Application Data

(63) Continuation of application No. 15/585,734, filed on May 3, 2017, now Pat. No. 10,553,731.

(51) Int. Cl.
*H01L 31/0216* (2014.01)
*H01L 31/0693* (2012.01)
*H01L 31/0735* (2012.01)
*H01L 31/18* (2006.01)

(52) U.S. Cl.
CPC .... *H01L 31/02167* (2013.01); *H01L 31/0693* (2013.01); *H01L 31/0735* (2013.01); *H01L 31/184* (2013.01); *H01L 31/1892* (2013.01)

(58) Field of Classification Search
CPC .......... H01L 31/02167; H01L 31/0693; H01L 31/0735; H01L 31/184; H01L 31/1892
See application file for complete search history.

(56) References Cited

U.S. PATENT DOCUMENTS

| | | | |
|---|---|---|---|
| 6,743,974 B2 | 6/2004 | Wada et al. | |
| 7,081,584 B2 | 7/2006 | Mook | |
| 9,331,228 B2 | 5/2016 | Vaid et al. | |
| 2010/0218819 A1* | 9/2010 | Farmer | H01L 31/0693 136/256 |
| 2012/0199184 A1* | 8/2012 | Nie | H01L 31/03046 136/255 |
| 2015/0162478 A1* | 6/2015 | Fafard | H01L 31/109 257/461 |

OTHER PUBLICATIONS

List of IBM Patents or Patent Applications Treated as Related dated Nov. 27, 2019, 2 pages.

* cited by examiner

*Primary Examiner* — Jayne L Mershon
(74) *Attorney, Agent, or Firm* — Tutunjian & Bitetto, P.C.; Erik Johnson

(57) ABSTRACT

A photovoltaic device that includes a p-n junction of first type III-V semiconductor material layers, and a window layer of a second type III-V semiconductor material on the light receiving end of the p-n junction, wherein the second type III-V semiconductor material has a greater band gap than the first type III-V semiconductor material, and the window layer of the photovoltaic device has a cross-sectional area of microscale.

7 Claims, 5 Drawing Sheets

FOCUSED ENERGY PHOTOVOLTAIC CELL

BACKGROUND

Technical Field

The present invention generally relates to photovoltaic devices, and more particularly to photovoltaic devices for receiving focused light.

Description of the Related Art

A photovoltaic device is a device that converts the energy of incident photons to electromotive force (e.m.f.). Photovoltaic devices include solar cells, which are configured to convert the energy in the electromagnetic radiation from the sun to electric energy.

SUMMARY

In one aspect, a photovoltaic device is provided that can generate power from the microwatt ($\mu$W) to milliwatt (mW) within a chip area of 100 $\mu$m×100 $\mu$m using focused light or laser light. In some embodiments, the photovoltaic device comprises a p-n junction of a first type III-V semiconductor material layers and a window layer of a second type III-V semiconductor material on the light receiving end of the p-n junction, wherein the second type III-V semiconductor material has a greater band gap than the first type III-V semiconductor material. The window layer of the photovoltaic device has a microscale cross-sectional area.

In another aspect, a photovoltaic device is provided that can generate power from the microwatt ($\mu$W) to milliwatt (mW) within a chip area of 100 $\mu$m×100 $\mu$m using focused light or laser light, in which the photovoltaic device includes a transparent dielectric layer in combination with a semiconductor material layer to provide a window layer for the device. In some embodiments, the photovoltaic device comprises a p-n junction of a first type III-V semiconductor material layers. A window bilayer is present on the light receiving end of the p-n junction, the window bilayer includes a second type III-V semiconductor material layer on the light receiving end of the p-n junction and a transparent dielectric layer present on the second type III-V semiconductor material layer. The second type III-V semiconductor material layer has a greater band gap than the first type III-V semiconductor material. The window bilayer of the photovoltaic device has a microscale cross-sectional area.

In another aspect, a method of forming a photovoltaic device is provided, in which the photovoltaic device can generate power from the microwatt ($\mu$W) to milliwatt (mW) within a chip area of 100 $\mu$m×100 $\mu$m using focused light or laser light. The method may include forming a p-n junction of type III-V semiconductor material layer having a microscale footprint on a supporting substrate; and forming a window layer on the light receiving end of the p-n junction. The window layer has a cross-sectional area of a microscale.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
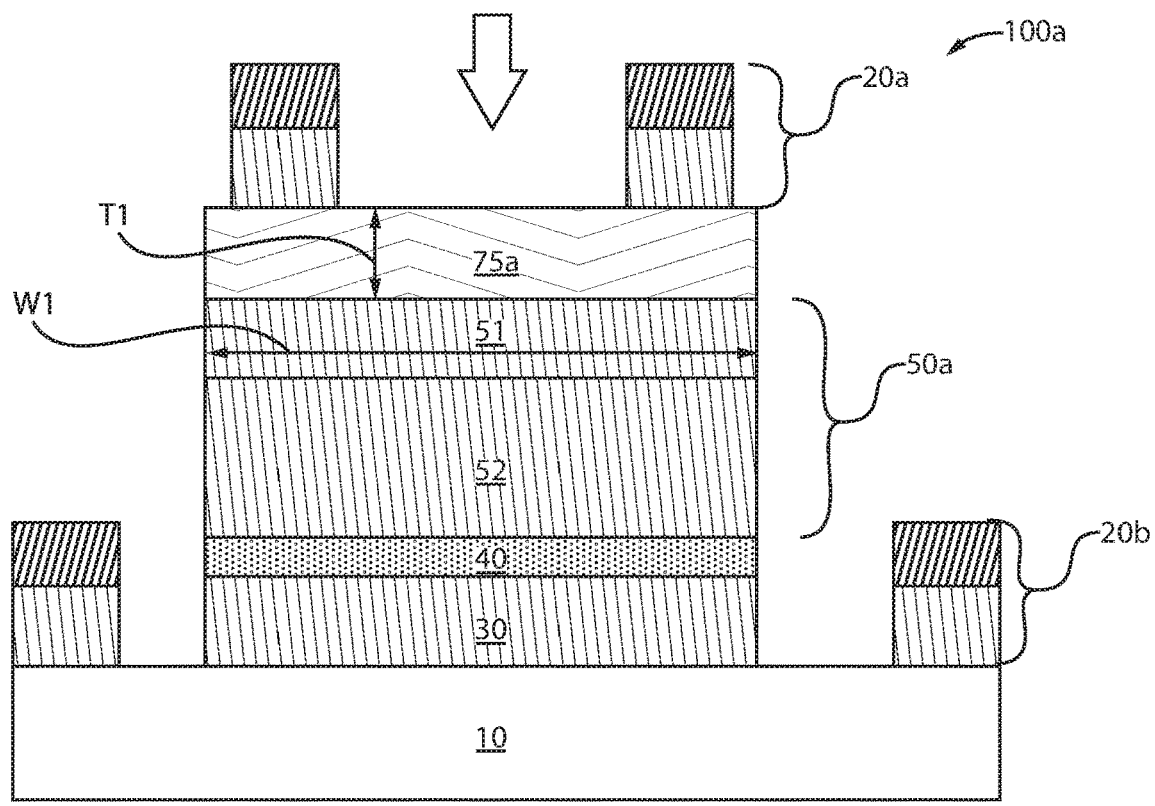
FIG. 1 is a side cross-sectional view of one embodiment of a photovoltaic device including a p-n junction of a first type III-V semiconductor material layers and a window layer of a second type III-V semiconductor material, wherein the window layer of the photovoltaic device has a microscale cross-sectional area.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the invention, as it is oriented in the drawing figures. The terms "overlying", "atop", "positioned on" or "positioned atop" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In one embodiment, the present disclosure provides photovoltaic cells, i.e., photovoltaic devices, needed for internet of things (IOT) applications. As used herein, a "photovoltaic device" is a device, such as a solar cell, that produces free electrons and/or vacancies, i.e., holes, when exposed to radiation, such as light, and results in the production of an electric current. A multi-junction photovoltaic device typically includes a multiple junctions of a semiconductor layer of a p-type conductivity that shares an interface with a semiconductor layer of an n-type conductivity, in which the interface provides an electrical junction.

Physically small, i.e., devices with a small footprint, having high voltage requirements are needed. The length and width dimensions of the monolithically formed devices of high voltage photovoltaics that are described herein may be no greater than 150 microns, e.g, may be equal to 100 microns or less. In one example, the photovoltaic devices that are described herein will have a footprint, i.e., width by length dimension, of 100 microns×100 microns. In some embodiments, the methods and structures described herein include a thick window layer and a thin base layer. This can provide an optimized structure for reduced resistance and can also provide a charge screening affect. The use of a thick window layer and a thin base layer is contrary to prior photovoltaic cells designs that employ a thin window layer and a thicker base layer. Previously, it was believed that a thin layer and a thicker base was advantageous for optimizing maximum absorption of sunlight, but it has been determined in focused light applications, such as laser light applications, a thicker window can be used to extract more charge at high output voltage, i.e., provide a high fill factor. The details of the methods and structures of the present disclosure are now described with greater detail with reference to FIGS. 1-8B.

FIG. 1A depicts one embodiment of a photovoltaic device 100a including a p-n junction 50a of first type III-V semiconductor material layers and a window layer 75a of a second type III-V semiconductor material. The window layer 75a of the photovoltaic device has a microscale cross-sectional area. By "microscale cross-sectional area" it is meant that the thickness T1, i.e., height dimension, and the depth dimension provide a cross-sectional area greater than 1 micron$^2$. For example, the thickness T1 of the window layer may range from 500 nm to 3 microns. In other examples, the thickness T1 of the window layer 75a may be equal to 500 nm, 600 nm, 700 nm, 800 nm, 900 nm, 1 micron, 1.25 microns, 1.5 microns, 1.75 microns, 2 microns and 3 microns, or any range of thicknesses having an upper limit and lower limit provided by the aforementioned examples. The depth dimension is the dimension that is perpendicular to both the thickness T1 and width dimension W1, i.e., is in a direction heading into and out of the page that FIG. 1A is illustrated on. The depth D1 dimension is better illustrated in FIG. 3, which is a top down view of a photovoltaic cell. In some examples, the depth D1 may range from 500 nm to 150 microns. In other examples, the depth D1 of the window layer 75 may be equal to 500 nm, 750 nm, 1000 nm, 5 microns, 50 microns, 75 microns, 100 microns, 125 microns, and 150 microns, or any range of thicknesses having an upper limit and lower limit provided by the aforementioned examples. It is noted, that the above examples for the window layer 75a having the microscale cross sectional area are provided for illustrative purposes only, and are not intended to limit the present disclosure, but are indicative of the type of dimensions that provide the increased fill factor, and for increasing the charge that can be extracted from the photovoltaic device in response to focused light and laser light applications.

The p-n junction 50a of the type III-V semiconductor material layer 50, as well as the window layer 75a, is composed of a type III-V semiconductor material. The term "III-V semiconductor material" denotes a semiconductor material that includes at least one element from Group IIIB of the Periodic Table of Elements under the Old International Union of Pure and Applied Chemistry (IUPAC) classification system, or Group 13 of the New International Union of Pure and Applied Chemistry classification system; and at least one element from Group VB of the Periodic Table of Elements, or Group 15 of the New International Union of Pure and Applied Chemistry classification system. In some embodiments, the III-V semiconductor material may be selected from the group of (AlSb), aluminum arsenide (AlAs), aluminum nitride (AlN), aluminum phosphide (AlP), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), gallium arsenide antimonide (GaAsSb), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), indium arsenide antimonide phosphide (InArSbP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide aluminum antimonide (GaInNAsSb), gallium indium arsenide antimonide phosphide (GaInAsSbP), and combinations thereof.

In some embodiments, the photovoltaic device is composed of a p-n junction of a first type III-V semiconductor material layers and a window layer of a second type III-V semiconductor material on the light receiving end of the p-n junction, wherein the second type III-V semiconductor material has a greater band gap than the first type III-V semiconductor material. The term "first type" and "second type" when describing the composition of the material layers for the window layer 75a and the p-n junction 50 mean that the composition for the window layer 75a and the p-n junction 50 are different. For example, the window layer 75a can be composed of indium gallium arsenide (InGaAs) or indium gallium phosphide (InGaP); and the p-n junction 50 may be composed of material layers, i.e., an emitter layer 51 and a base layer 52, that are composed of gallium arsenide (GaAs). The material layers for the p-n junction 50 are selected so that the window layer 75a is composed of a semiconductor material having a greater band gap, i.e., wider band gap, than the material layers of the p-n junction 50. A "band gap", also called an energy gap or bandgap, is an energy range in a solid where no electron states can exist. Plotted in a graph, the band gap is the energy difference (in electron volts) between the top of the valence band and the bottom of the conduction band in insulators and semiconductors. It is the energy to promote a valence electron bound to an atom to become a conduction electron, which is free to move within the crystal lattice and serve as a charge carrier to conduct electric current. For example, gallium arsenide (GaAs) as used in the p-n junction 50 has a band gap of 1.39 eV, while indium gallium phosphide (InGaP) for the window layer 75a has a band gap that can range from 1.87 eV to 1.92 eV. Further, aluminum gallium arsenide (AlGaAs) as a material for the window layer 75a has a band gap that can range from 1.42 eV to 2.16 eV, which is greater than the band gap of gallium arsenide, as used for the p-n junction 50. By selecting that the window layer 75a is composed of a greater band gap material than the p-n junction 50, a majority of the light passes through the window layer 75a to the p-n junction 50, at which the light is absorbed.

The window layer 75a can be in direct contact with an emitter layer 51 of the p-n junction. 50. The emitter layer 51 of the p-n junction has a first conductivity type and is in direct contact with a base layer 52 that has a second conductivity type. In some embodiments, the window layer 75a has a same conductivity type, i.e., first conductivity type, as the emitter layer 51. The term "conductivity type" when describing a semiconductor material denotes that the material is doped to an n-type conductivity or a p-type conductivity. In the example that is depicted in FIG. 1, the first type conductivity of the window layer 75a and the emitter layer 51 of the p-n junction 50 is an n-type conductivity type, while the second conductivity type of the base layer 52 of the p-n junction 50 is a p-type conductivity type. As used herein, "p-type" refers to the addition of impurities to an intrinsic semiconductor that creates deficiencies of valence electrons. As used herein, "n-type" refers to the addition of impurities that contributes free electrons to an intrinsic semiconductor. In a type III-V semiconductor material, the effect of the dopant atom, i.e., whether it is a p-type or n-type dopant, depends upon the site occupied by the dopant atom on the lattice of the base material. In a III-V semiconductor material, atoms from group II act as acceptors, i.e., p-type, when occupying the site of a group III atom, while atoms in group VI act as donors, i.e., n-type, when they replace atoms from group V. Dopant atoms from group IV, such a silicon (Si), have the property that they can act as acceptors or donor depending on whether they occupy the site of group III or group V atoms respectively. Such impurities are known as amphoteric impurities.

It is noted that the above examples of the conductivity types for the window layer 75 and the p-n junction 50 are provided for illustrative purposes only, and are not intended to limit the present disclosure to only those conductivity types. For example, the window layer 75 and the emitter layer 51 of the p-n junction 50 can also be p-type, while the base layer 52 of the p-n junction 50 can also be n-type.

The emitter layer 51 of the first conductivity type, i.e., n-type, is in direct contact with a base layer 52 of the second conductivity type, i.e., p-type, wherein due to this joining, excess electrons from n-type try to diffuse with the holes of p-type whereas excess hole from p-type try to diffuse with the electrons of n-type. Movement of electrons to the p-type side exposes positive ion cores in the n-type side of the p-n junction 50, while movement of holes to the n-type side exposes negative ion cores in the p-type side of the p-n junction 50, resulting in an electron field at the junction and forming the depletion region. Absorption of incident photons at the p-n junction 50 create electron-hole pairs, in which electron-hole pairs generate in the solar cell provided that the incident photon has an energy greater than that of the band gap. Collection of these carriers by the p-n junction prevents recombination by using a p-n junction to spatially separate the electron and the hole. The carriers are separated by the action of the electric field existing at the p-n junction. If the light-generated minority carrier reaches the p-n junction, it is swept across the junction by the electric field at the junction, where it is now a majority carrier. If the emitter and base of the solar cell are connected together (i.e., if the solar cell is short-circuited), then the light-generated carriers flow through the external circuit.

The collection of light-generated carriers does not by itself give rise to power generation. In order to generate power, a voltage must be generated as well as a current. Voltage is generated in a solar cell by a process known as the "photovoltaic effect." The collection of light-generated carriers by the p-n junction 50 causes a movement of electrons to the n-type side and holes to the p-type side of the junction. Under short circuit conditions, the carriers exit the device as light-generated current.

The emitter layer 51 of the p-n junction 50 can have a thickness that is less than the window layer 75a. The emitter layer 51 also has a thickness that is less than the thickness of the base layer 52. For example, the emitter layer 51 has a thickness that can be nanoscale. By "nanoscale" it is meant that the thickness is less than 1 microns. In some embodiments, the thickness of the emitter layer 51 is selected to be 500 nm or less. In some embodiments, the thickness of the emitter layer 51 may range from 50 nm to 250 nm. In one example, the thickness of the emitter layer 51 may be equal to 100 nm.

In contrast to the emitter layer 51, the base layer 52 typically has a macroscale thickness. By "macroscale" it is meant that the thickness is greater than 1 micron. In some embodiments, the thickness of the base layer 52 is 1 micron or greater. For example, the thickness of the base layer 52 can range from 1 micron to 10 microns. In some embodiments, the thickness of the base layer 52 ranges from 2 microns to 5 microns. In one example, the thickness of the base layer 52 is 3 microns.

The base layer 52 of the p-n junction 50 may be in direct contact with a back surface field (BSF) layer 40. The back surface field (BSF) layer 40 can be composed of the same base semiconductor material as the window layer 75a. In some embodiments, the window layer 75a is used in order to reduce the surface recombination velocity. Similarly, a back-surface field (BSF) layer 40 reduces the scattering of carriers towards the tunnel junction. Further, both the window layer 75a and BSF layers 40 can be transparent to wavelengths absorbed by the next p-n junction. The back surface field (BSF) layer 40 can be composed of aluminum gallium arsenide (AlGaAs), and can have a thickness ranging from 100 nm to 3 microns. The BSF layer 40 can have a same conductivity type as the base layer 52 of the p-n junction 50. For example, the BSF layer 40 can be doped to an n-type conductivity type.

In some embodiments, a buffer layer 30 may be present between the (BSF) layer 40 and the substrate 10. The buffer layer 30 is typically composed of a semiconductor material having a lattice dimension between the supporting substrate 10 and the BSF layer 40. For example, the buffer layer 30 may be composed of gallium arsenide. The conductivity type of the buffer layer 30 is typically the same as the conductivity type of the back surface filed layer 40. For example, if the base layer 52 of the p-n junction is n-type, the BSF layer 40 is also n-type, and the buffer layer 30 is also n-type.

The supporting substrate 10 is present at the end of the photovoltaic device that is opposite the light receiving end of the device, at which the window layer 75a is present. The supporting substrate 10 is composed of an electrically conductive semiconductor material. For example, the supporting substrate 10 may be composed of a type IV semiconductor material, such as silicon or germanium or silicon germanium, or a type III-V semiconductor material. In one example, the supporting substrate 10 is composed of p-type gallium arsenide.

Figure 3:
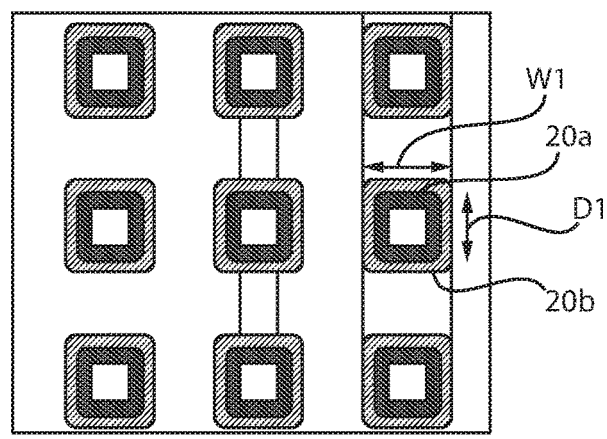
FIG. 3 is a top down view of a photovoltaic cell, in accordance with some embodiments of the present disclosure.

Still referring to FIG. 1, in some embodiments, the photovoltaic device 100 includes contacts 20a, 20b. The first set of contact 20a is in direct contact with the window layer 75, and includes a bilayer of a type III-V semiconductor material, such as gallium arsenide (GaAs), and an metal containing layer, such as a metal layer or metal semiconductor alloy. The second set of contacts 20b are in direct contact with the supporting substrate 10 and similar to the first set of contacts 20b may be composed of a bilayer of a bilayer of a type III-V semiconductor material, such as gallium arsenide (GaAs), and an metal containing layer, such as a metal layer or metal semiconductor alloy. The metal of the metal containing layer may be aluminum, copper, titanium, tungsten and combinations thereof. Referring to FIG. 3, both of the first and second set of contacts 20a, 20b have a width and length dimension to be contained within a 100 micron×100 microns footprint. In some embodiments, the narrower metal line reduces shadowing.

The photovoltaic device 100a that is depicted in FIG. 1 can generate power ranging from the microwatt (μW) to milliwatt (mW) within a chip area of 100 μm×100 μm. The above noted power can be generated from laser light, lamp light or LED light, which can have wavelengths ranging from 400 nm to 870 nm for GaAs absorption layer. For example, indoor sunlight that is suitable for application to the photovoltaic device 100a may be 100 mW/cm$^2$. For example, average room light that is suitable for application to the photovoltaic device 100a may be 0.5 mW/cm$^2$. For example, laser light that is suitable for application to the photovoltaic device 100a may be 50 mW/5 mm$^2$, and may be provided by a red pointer device. In another example, laser light that is suitable for application to the photovoltaic device 100a may be 5 mW/10 microns$^2$, and may be provided by light having an 850 nm wavelength.

Figure 2:
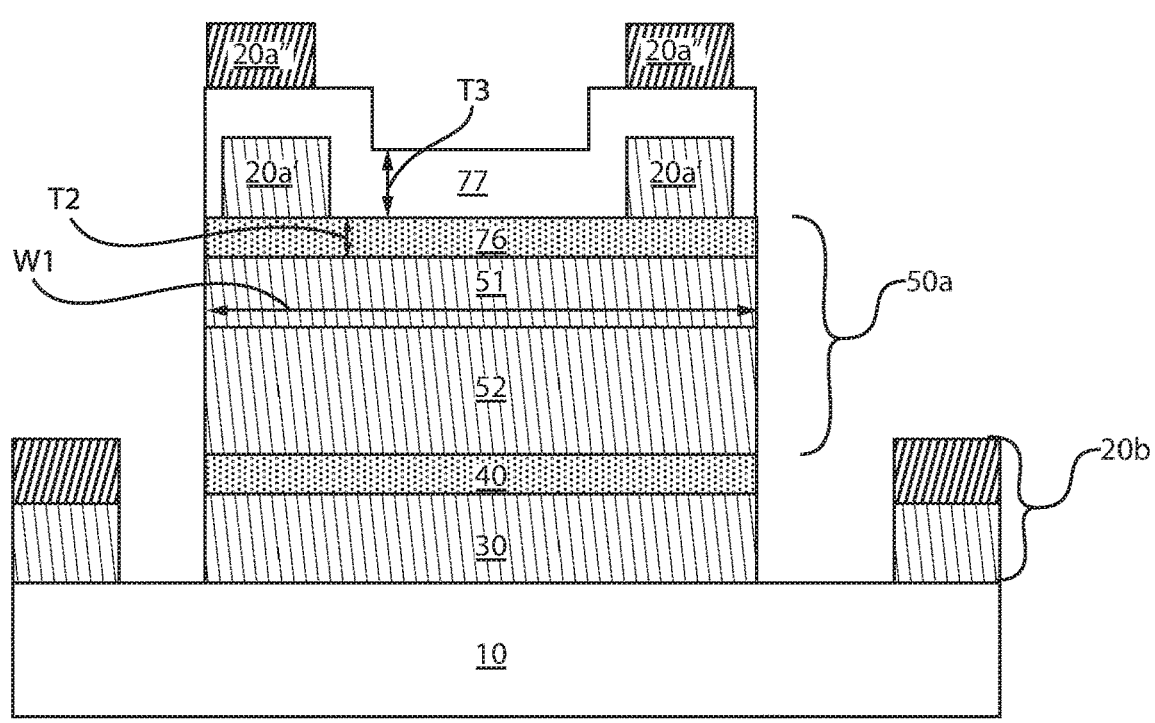
FIG. 2 is a side cross-sectional view of one embodiment of a photovoltaic device including a p-n junction of first type III-V semiconductor material layers, and a window bilayer is present on the light receiving end of the p-n junction, the window bilayer includes a second type III-V semiconductor material layer and a transparent dielectric layer, in which the window bilayer of the photovoltaic device has a microscale cross-sectional area.

FIG. 2 depicts one embodiment of a photovoltaic device 100b including a p-n junction 50b of first type III-V semiconductor material layers, and a window bilayer 75b that is present on the light receiving end of the p-n junction 50b, in which the window bilayer 75b includes a second type III-V semiconductor material layer 76 and a transparent dielectric layer 77, in which the window bilayer 75b of the photovoltaic device has a microscale cross-sectional area. The photovoltaic device 100b that is depicted in FIG. 2 is similar to the photovoltaic device 100a that is depicted in FIG. 1 with the exception that the embodiment that is depicted in FIG. 2 includes a window bilayer 75b in which the two layers 76, 77 combined have a micro scale cross-sectional area, and the window layer 75a for the embodiment depicted in FIG. 1 includes a single material layer of a type III-V semiconductor material having a micro scale cross-sectional area. Therefore, the above descriptions for the supporting substrate 10, the buffer layer 30, the back surface field layer 40, and the p-n junction 50a that are depicted in FIG. 1 are suitable for describing at least one embodiment of the supporting substrate 10, the buffer layer 30, the back surface field layer 40, and the p-n junction 50a that are depicted in FIG. 2.

The window bilayer 75b is composed of a second type III-V semiconductor material layer 76 on a light receiving end of the p-n junction 50b and a transparent dielectric layer 77 present on the second type III-V semiconductor material layer 76, in which the second type III-V semiconductor material layer 76 has a greater band gap than the first type III-V semiconductor material of the p-n junction 50b, and the window bilayer of the photovoltaic device has a cross-sectional area of microscale. In the example depicted in FIG. 2, the second type III-V semiconductor material layer 76 of the window bilayer 75b is composed of indium gallium phosphide (InGaP) or aluminum gallium arsenide (AlGaAs), and the first type III-V semiconductor material layers of the p-n junction 50b can be composed of gallium arsenide (GaAs) layers. For example, the second type III-V semiconductor material layer 76 of the window bilayer 75b can be doped with an n-type dopant to provide n-type indium gallium phosphide (InGaP) or n-type aluminum gallium arsenide (AlGaAs). In some embodiments, the p-n junction 50b includes an emitter layer 51 that is composed of n-type gallium arsenide (GaAs), and a base layer 52 that is composed of p-type gallium arsenide (GaAs). As noted above further details, such as the composition, function and dimension, for the emitter and base layers 51, 52 of the p-n junction 50b are provided in the above description of the p-n junction 50a for the device depicted in FIG. 1. For example, the first gallium and arsenic containing layer for the emitter layer 51 of the p-n junction can have a nanoscale thickness, and the second gallium and arsenic containing layer for the base layer 52 of the p-n junction can have a microscale thickness.

One difference between the embodiment of the photovoltaic device 100a that is depicted in FIG. 1, and the photovoltaic device 100b that is depicted in FIG. 2 is that although the second type III-V semiconductor material layer 76 of the window bilayer 75b for the device depicted in FIG. 2 can have a similar composition as the single semiconductor material layer as the window layer 75a for the device that is depicted in FIG. 1, the dimensions of the second type III-V semiconductor material layer 76 of the window bilayer 75b is different from the dimension of the window layer 75a of the device that is depicted in FIG. 1. For example, the dimensions of the window layer 75a of the device that is depicted in FIG. 1 are selected to provide for a microscale cross section having a thickness that can be up to a few microns, whereas the thickness dimension of the second type III-V semiconductor material layer 76 may be on the nanoscale, i.e., less than 1 micron in thickness. For example, the thickness of the second type III-V semiconductor material layer 76 of the photovoltaic device 100b that is depicted in FIG. 2 can be less than the thickness of the emitter layer 51 of the p-n junction 50b. In one example, the thickness of the second type III-V semiconductor material layer 76 may range from 10 nm to 1 micron. In other examples, the thickness of the second type III-V semiconductor material layer 76 can range from 10 nm to 500 nm. In yet other examples the thickness of the second type III-V semiconductor material layer 76 can range from 25 nm to 100 nm. In one example, the thickness of the second type III-V semiconductor material layer 76 for the bilayer window 75b is 50 nm.

The second layer of the bilayer window 75b is a transparent oxide material 77 that can be selected to allow for laser light, lamp light or LED light to pass through the transparent oxide material 77 without attenuation. The transparent oxide material 77 is an electrically conductive layer that is in direct contact with a majority of the second type III-V semiconductor material layer 76. The transparent oxide (TCO) material 77 may be indium tin oxide (ITO), but alternatives can include fluorine doped tin oxide (FTO), or doped zinc oxide (ZnO).

The thickness of the transparent oxide material 77 is selected to extract more charge from the photovoltaic device 100b at high output voltage, e.g., provide a high fill factor. For example, the thickness of the transparent oxide material 77 can be selected so that the combination of the transparent oxide material 77 and the second type III-V semiconductor material layer 76 of the p-n junction 50 has a microscale cross-sectional area. For example, when the second type III-V semiconductor material layer 76 of the window bilayer 75 has a thickness ranging from 200 nm to 1 micron, the transparent conductive oxide 77 can have a thickness ranging from 100 nm to 5 microns. In some embodiments, the transparent conductive oxide 77 can have a thickness ranging from 200 nm to 800 nm. In other embodiments, the transparent conductive oxide 77 can have a thickness of 300 nm to 700 nm.

The transparent conductive oxide 77 may have a conformal thickness and may be present over electrodes 20a' of a type III-V semiconductor material that are present on opposing ends of the second type III-V semiconductor material layer 76 of the window bilayer 75b. The term "conformal" denotes a layer having a thickness that does not deviate from greater than or less than 30% of an average value for the thickness of the layer. A second set of electrodes 20a'' may be present on the transparent conductive oxide 77 that are present over the electrodes 20a' to the second type III-V semiconductor material layer 76. Another set of electrodes 20b, which may also be composed of a type III-V semiconductor material, e.g., gallium arsenide (GaAs), may be present in contact with the substrate 10.

In some embodiments, the photovoltaic device 100b that is depicted in FIG. 2 can generate power ranging from the microwatt (μW) to milliwatt (mW) within a chip area of 100 μm×100 μm. The above noted power can be generated from laser light, lamp light or LED light, which can have wavelengths ranging from 400 nm to 870 nm for GaAs. For example, indoor sunlight that is suitable for application to the photovoltaic device 100b may be 100 mW/cm². For example, average room light that is suitable for application to the photovoltaic device 100a may be 0.5 mW/cm². For example, laser light that is suitable for application to the photovoltaic device 100b may be 50 mW/5 mm², and may be provided by a red pointer device. In another example, laser light that is suitable for application to the photovoltaic device 100a may be 5 mW/10 microns², and may be provided by light having an 850 nm wavelength.

FIG. 3 is a top down view depicting one embodiment of a photovoltaic cell 100a, as described above with reference to FIG. 1. FIG. 3 illustrates that the size of the photovoltaic cell 100a can provide that the both the first set of electrodes 20a and the second set of electrodes 20b can be incorporated within a footprint of 100 microns by 100 microns. The narrower metal lines reduce shadowing. The top down view depicted in FIG. 3 is of the device depicted in FIG. 1, but the representation can also be applied to the device depicted in FIG. 2, in which the first set of electrodes would be provided by electrodes 20a', 20a'', and the second set of electrodes would be provided by 20b.

Figure 4:
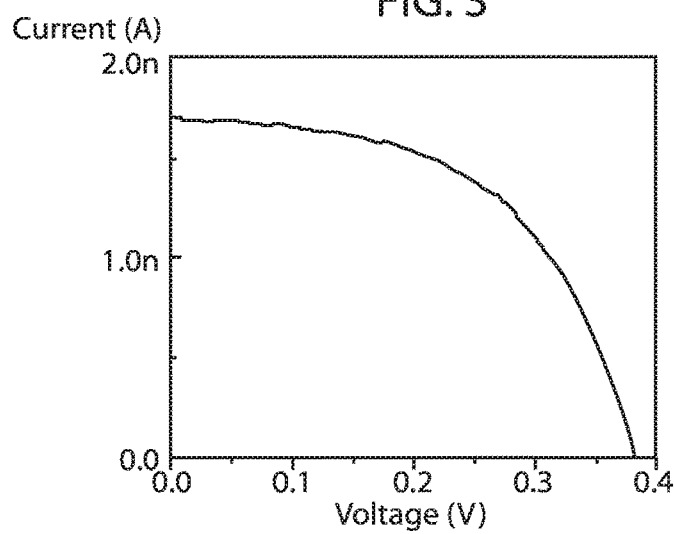
FIG. 4 is a plot of electrical performance, i.e., current as a function of voltage, for a photovoltaic device having a structure consistent with the structures described in FIGS. 1-3 when subjected to room lighting on the order of approximately 400 mW/cm$^2$.

FIG. 4 is a plot of electrical performance, i.e., current as a function of voltage, for a photovoltaic device having a structure consistent with the structures described in FIGS. 1-3 when subjected to room lighting on the order of approximately 400 mW/cm². The open voltage (Voc) was equal to 380 mV, the short circuit current Jsc was equal to 1.7 nano Ampere, the fill factor (FF) was equal to 0.5 and the power out (Pout) was equal to 0.4 nW.

Figure 5:
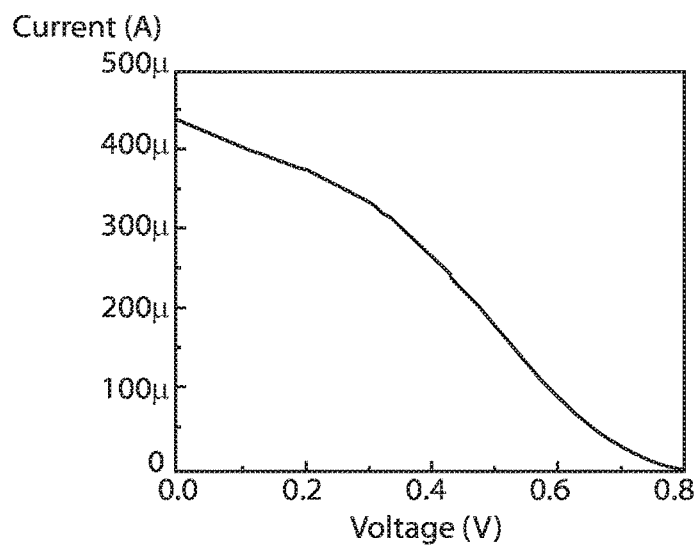
FIG. 5 is a plot of electrical performance, i.e., current as a function of voltage, for a photovoltaic device having a structure consistent with the structures described in FIGS. 1-3 when subjected to the light of a red laser pointer on the order of approximately 50 mW/cm$^2$.

FIG. 5 is a plot of electrical performance, i.e., current as a function of voltage, for a photovoltaic device having a structure consistent with the structures described in FIGS. 1-3 when subjected to the light of a red laser pointer on the order of approximately 50 mW/cm². The open voltage (Voc) was equal to 800 mV, the short circuit current Jsc was equal to 20 μA, the fill factor (FF) was equal to 0.8 and the power out (Pout) was equal to 13 μW. In some embodiments, the power out (Pout) may be increased to as much as 60 μW if shadowing can be eliminated, e.g., with the addition of backside illumination.

Figure 6:
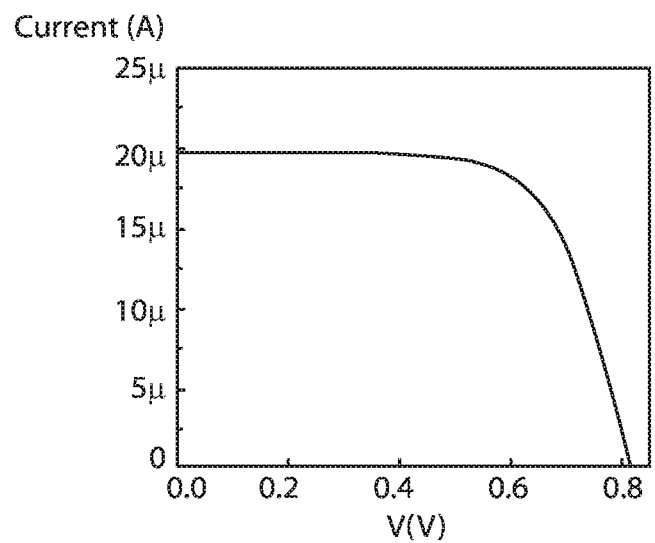
FIG. 6 is a plot of electrical performance, i.e., current as a function of voltage, for a photovoltaic device having a structure consistent with the structures described in FIGS. 1-3 when subjected to 830 nm laser focused with lensed fiber with approximately 1.4 mW/10 microns.

FIG. 6 is a plot of electrical performance, i.e., current as a function of voltage, for a photovoltaic device having a structure consistent with the structures described in FIGS. 1-3 when subjected to 830 nm laser focused with lensed fiber with approximately 1.4 mW/10 microns. The open voltage (Voc) was equal to 800 mV, the short circuit current (Jsc) was equal to 430 μA, the fill factor (FF) was equal to 0.3 and the power out (Pout) was equal to 103 μW. In some embodiments, the power out (Pout) can be increased to 1 mW with the use of a higher power laser. The power conversion efficiency is ~33%.

Figure 7A:
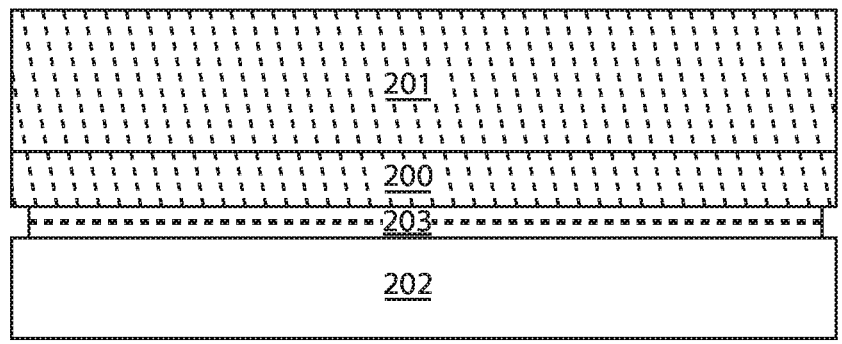
FIG. 7A is a side cross-sectional view of an initial structure used in one embodiment of a method for forming photovoltaic devices, in which a photovoltaic wafer is adhesively bound to a handling wafer, in accordance with one embodiment of the present disclosure.

In another aspect, a method of forming a photovoltaic device is providing that includes forming a p-n junction 50a, 50b of type III-V semiconductor material layer having a microscale footprint on a supporting substrate 10; and forming a window layer 75a, 75b on the light receiving end of the p-n junction 50a, 50b, the window layer has a cross-sectional area of a microscale. Referring to FIG. 7A, the method may begin with forming the material layers for the pn-junction 50a, 50b, and the window layer 75a, 75b. The type III-V semiconductor material layers, i.e., first type III-V semiconductor material layer for the p-n junction 50a, 50b and the second type III-V semiconductor material layer 75a, 76 for the window layer 75a, 75b, may be formed using a deposition process, such as chemical vapor deposition (CVD), and in some embodiments may include an epitaxial growth process. In some embodiments, at least one layer of the type III-V semiconductor materials, e.g., aluminum gallium arsenide and/or gallium arsenide, can be formed using a low hydrogen deposition process. The term "low hydrogen" denotes that the deposition step has a maximum hydrogen content of $1\times10^{18}$ cm$^{-3}$. The deposition process for providing a low-hydrogen content could be metal organic chemical vapor deposition (MOCVD) or molecular beam epitaxy (MBE).

The terms "epitaxial growth and/or deposition" means the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

Chemical vapor deposition (CVD) is a deposition process in which a deposited species is formed as a result of chemical reaction between gaseous reactants at greater than room temperature (25° C. to 900° C.); wherein solid product of the reaction is deposited on the surface on which a film, coating, or layer of the solid product is to be formed. Variations of CVD processes include, but not limited to, Atmospheric Pressure CVD (APCVD), Low Pressure CVD (LPCVD) and Plasma Enhanced CVD (PECVD), Metal-Organic CVD (MOCVD) and combinations thereof may also be employed. In some preferred embodiments, the CVD process used to form the lower junction may be metal organic chemical vapor deposition.

A number of different sources may be used for the deposition of epitaxial type III-V semiconductor material. In some embodiments, the sources for epitaxial growth of type III-V semiconductor material include solid sources containing In, Ga, N, P elements and combinations thereof and/or a gas precursor selected from the group consisting of trimethylgallium (TMG), trimethylindium (TMI), Trimethylaluminum (TMA), tertiary-butylphosphine (TBP), phosphine (PH$_3$), ammonia (NH$_3$), and combinations thereof.

The material layers for the emitter layer 51 of the p-n junction 50a, 50b, and the base layer 52, may be doped n-type or p-type using in situ doping. By "in-situ" it is meant that the dopant that provides the conductivity type of the material layer, e.g., material layer that contributes to providing a junction, is introduced as the material layer is being formed. To provide for in-situ doped p-type or n-type conductivity, the dopant gas may be selected from the group consisting of bis-cyclopentadienyl-magnesium (Cp$_2$Mg), silane (SiH$_4$), disilane (Si$_2$H$_6$), germane (GeH$_4$), carbon tetrabromide (CBr$_4$) and combinations thereof. Similarly, the semiconductor layers of the window layer 75a, 76 may be doped using in situ doping.

It is further noted that the BSF layers 40, the buffer layer 30, and the supporting substrate 10 may be formed using epitaxial deposition, e.g., via chemical vapor deposition, in combination with in situ doping. The combination of the window layer 75a, 75b, the p-n junction 50a, 50b, the BSF layer 40, the buffer layer 30 and the supporting substrate 10 may be formed in a material stack, which can be referred to as a III-V photovoltaic cell stack, that is collectively depicted as reference number 200 in FIG. 7A.

In some embodiments, the III-V photovoltaic cell stack 200 is formed on a growth substrate 201. The growth substrate 201 may be composed of germanium (Ge). In one example, forming the III-V photovoltaic cell stack 200 may begin with the second type III-V semiconductor material that provides the window layer 75a, 76 being epitaxially formed on a deposition surface of the growth substrate 201. This can be followed by deposition sequence for the emitter layer 51 of the p-n junction 50a, 50b, the base layer 52 of the p-n junction 50a, 50b, and the back surface field (BDF) layer 40. In a following process sequence the buffer layer 30 and the supporting substrate 10 may be deposited. It is noted that this is only one example of a method for forming the photovoltaic cell stack 200, and that other deposition process sequences may be equally applicable.

For example, in some embodiments, a semiconductor contact layer may be formed on the window layer 75a, 76a that is to be patterned in a later process step to provide contacts to the window layer 75a, 76.

Figure 7B:
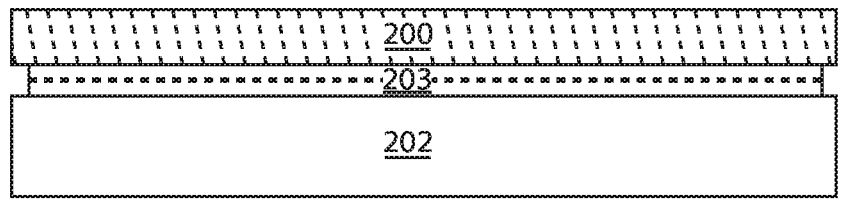
FIG. 7B is a side cross-sectional view depicting one embodiment of removing the germanium containing substrate from the structure depicted in FIG. 7A.

Referring to FIG. 7B, following the formation of the III-V photovoltaic cell stack 200, the combined structure may be adhesively bonded to a glass handling substrate 202. The adhesive bonding layer that is present between the III-V photovoltaic cell stack 200 and the glass handling substrate 202 is identified by reference number 203. In a following process step, the growth substrate 201 may be removed. For example, the growth substrate 201 may be removed using a spalling process, grinding, etching, separation by ion implantation (SIMOX), or a combination of the aforementioned processes.

Figure 7C:
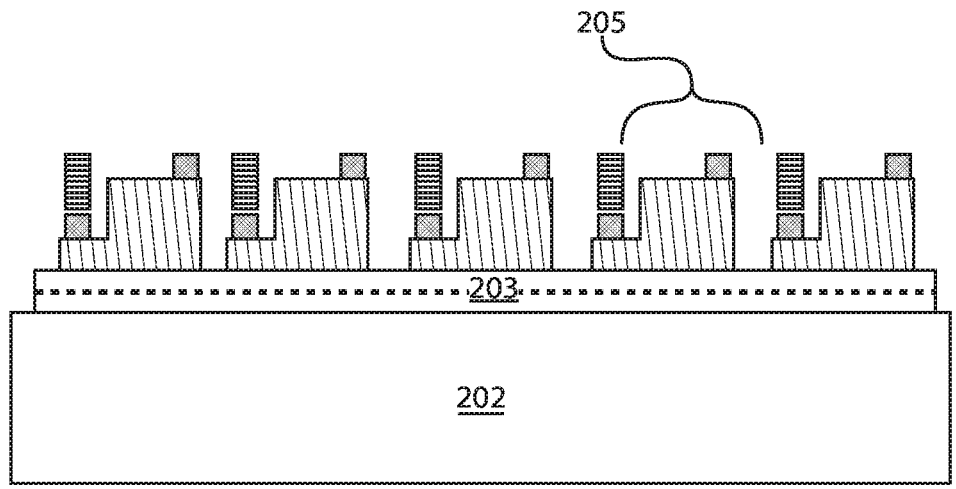
FIG. 7C is a side cross-sectional view depicting one embodiment of processing the III-V cell layers to provide at least one of the photovoltaic structures that are depicted in FIGS. 1 and 3.

FIG. 7C illustrates one embodiment of processing the III-V cell layers of the III-V photovoltaic cell stack 200 to provide at least one of the photovoltaic structures that are depicted in FIGS. 1-3. In some embodiments, some of the material layers for the window layers 75a, 75b, the p-n junction 50a, 50b and the back surface field layer 40 may be formed at this step of the process flow if not formed previously. For example, in some embodiments, a semiconductor contact layer may be formed on the window layer 75a, 76a that is to be patterned in a later process step to provide contacts to the window layer 75a, 76.

In some embodiments, the III-V photovoltaic cell stack 200 may be patterned and etched at this stage of the process flow to provide the geometry of the stack of semiconductor materials that are depicted in FIGS. 1 and 2. In some embodiments, the pattern and etch process steps performed at this stage of the process flow may determine the foot print, i.e., width W1 and depth D1 dimension (as depicted in FIG. 3), for each of the photovoltaic devices 100a, 100b. For example, a photoresist mask may be formed on the uppermost semiconductor layer, e.g., the window layer 75a, 76, of the III-V photovoltaic cell stack 200. The photoresist mask may be formed by applying a photoresist layer, exposing the photoresist layer to a pattern of radiation, and then developing the pattern into the photoresist layer utilizing a resist developer. The exposed potions of the semiconductor material layers that provide the window layer 75a, 76, the p-n junction 50a, 50b, the back surface field layer 40 and the buffer layer 30 may then be etched using an etch process, such as an anisotropic etch, e.g., reactive ion etch (RIE), or an isotropic etch, such as a wet chemical etch. In some embodiments, the etch process may be selective to the supporting substrate 10. In some embodiments, when a semiconductor layer for forming contact to the window layer 75a, 76 is present, and additional etch process may pattern the contact layer.

Thereafter, the contacts 20a, 20a', 20b may be formed to each of the window layer 75a, 76 and supporting substrate 10 using deposition, photolithography and etching processes. In some embodiments, the contacts 20a, 20b may include a semiconductor portion, such as a doped III-V semiconductor material, e.g., n-type and/or p-type gallium arsenide (GaAs) and a metal contact upper layer. As noted above, a semiconductor contact layer may be formed on the upper surface of the window layer 75a, 76 that provides the semiconductor portion of the contacts 20a, 20a' to the window layer 75a, 76. The buffer layer 30 may be patterned to provide the semiconductor portion of the contacts 20b to the supporting substrate 10.

The metal contact upper layer for the contacts 20a, 20a', 20b may be deposited using a physical vapor deposition (PVD) process. The PVD process may include plating, electroplating, electroless plating and combinations thereof. The deposited metal layers may be patterned and etched, along with the underlying semiconductor portions, using photolithography and etching to provide the desired geometry of the contacts 20a, 20a', 20b.

To provide the conductive oxide layer 77 for the embodiment of the photovoltaic device 100b that is depicted in FIG. 2, a contact 20a' may first be formed to the second type III-V semiconductor material layer 76 of the window layer 75b, Thereafter, the conductive oxide layer 77 may be conformally deposited over the contacts 20a' and the exposed surfaces of the second type III-V semiconductor material layer 76 of the window layer 75b. In a following process step, contacts 20a" to the conductive oxide layer 77 may be formed on the conductive oxide layer 77 of the window layer 75b that are overlying the contacts 20a' to the type III-V semiconductor material layer 76 of the window layer 75b. The conductive oxide layer 77 may be formed using a deposition process, such as chemical vapor deposition (CVD), e.g., plasma enhanced chemical vapor deposition (PECVD).

Referring to FIG. 7C, following patterning of the III-V photovoltaic cell stack 200, the optional formation of the conductive oxide layer, and the formation of the contacts structure, the resultant structure can be a photovoltaic device 100a, 100b, as depicted in FIGS. 1-3. The aforementioned photovoltaic devices that are depicted in FIG. 7C are identified by reference number 205.

Figure 7D:
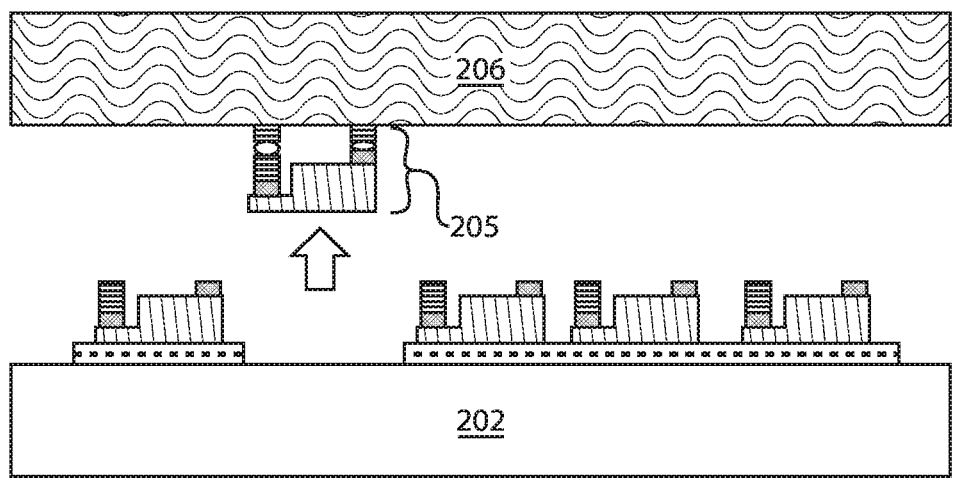
FIG. 7D is a side cross-sectional view depicting transferring the photovoltaic structures that are formed in FIG. 7C to a carrier wafer.

FIG. 7D depicting transferring the photovoltaic structures 205 that are formed in FIG. 7C to a carrier wafer 206. The carrier wafer 206 may be composed of a type IV semiconductor, such as silicon (Si). The photovoltaic structures 205 may be bonded to the carrier wafer 206 using adhesive bonding. In other embodiments, the photovoltaic structures 205 may be bonded to the carrier wafer 206 using solder bump technology.

Following bonding of the photovoltaic structures 205 to the carrier wafer 206, the photovoltaic structures 205 may be de-bonded from the glass handling substrate 202. Debonding may be provided by any process that removes the adhesive nature of the adhesive bonding layer 203, which can include heating, e.g., laser heating.

In some embodiments, the method that is described with reference to FIGS. 7A-7D can achieve shadow free back side illumination to increase the output power of the photovoltaic devices. Further, by using the method depicted in FIGS. 7A-7D, the need to develop III-V deep reactive ion etch (RIE) processes for photovoltaic cell isolation is eliminated.

EXAMPLE

Figure 8A:
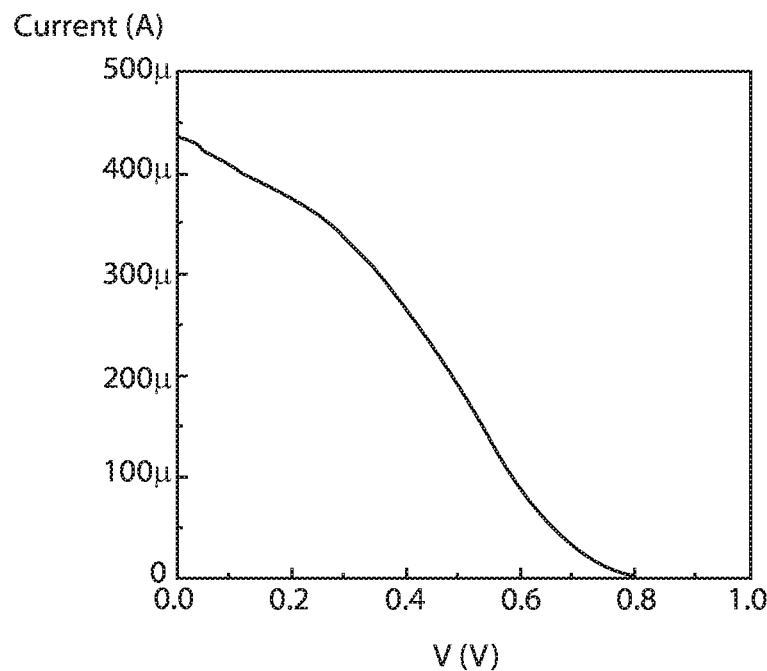
FIG. 8A is a plot of electrical performance, i.e., current as a function of voltage, for a photovoltaic device including a window layer having a cross sectional area that is less than the cross sectional area of the photovoltaic devices depicted in FIGS. 1 AND 2, when subjected to 830 nm laser focused from a laser diode of approximately 1.4 mW.

FIG. 8A is a plot of electrical performance, i.e., current as a function of voltage, for a photovoltaic device including a window layer having a cross sectional area that is less than the cross sectional area of the photovoltaic devices depicted in FIGS. 1 and 2, when subjected to 830 nm laser focused from a laser diode of approximately 1.4 mW. The comparative photovoltaic device used to provide the data for the plot depicted in FIG. 8A included a window layer of n-type indium gallium nitride having a thickness of 50 nm, and a p-n junction having an emitter layer composed of n-type gallium arsenide having a thickness of 100 nm and a base layer of p-type gallium arsenide having a thickness of 3 microns. The comparative photovoltaic device also included a back surface field layer composed of indium gallium phosphide and a buffer layer of p-type gallium arsenide, which is present on a p-type germanium substrate. The photovoltaic device also had a 100 micron×100 micron footprint.

Figure 8B:
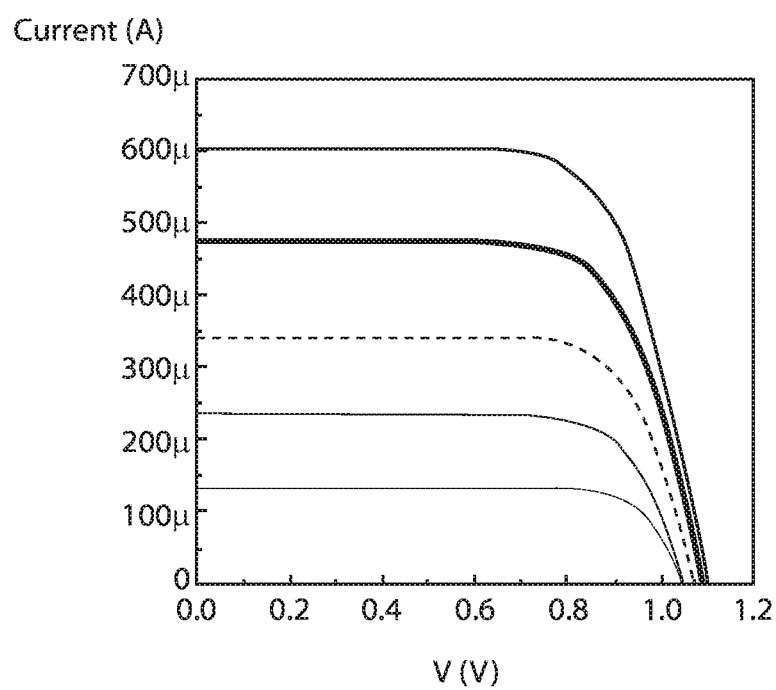
FIG. 8B is a plot of electrical performance, i.e., current as a function of voltage, for a photovoltaic device having a structure consistent with the structures described in FIGS. 1-3 when subjected to 830 nm laser focused from a laser diode of approximately 1.4 mW.

FIG. 8B is a plot of electrical performance, i.e., current as a function of voltage, for a photovoltaic device having a structure consistent with the structures described in FIGS. 1-3 when subjected to 830 nm laser focused from a laser diode of approximately 1.4 mW. More specifically, the photovoltaic device that provided the data for FIG. 8B included a window layer of n-type aluminum gallium arsenic having a thickness of 1 micron, and a p-n junction having an emitter layer composed of n-type gallium arsenide having a thickness of 100 nm and a base layer of p-type gallium arsenide having a thickness of 1.5 microns. The photovoltaic device also included a back surface field layer composed of aluminum gallium phosphide and a buffer layer of p-type gallium arsenide, which is present on a p-type gallium arsenide substrate. The photovoltaic device also had a 100 micron×100 micron footprint.

The data plotted in FIG. 8A indicated high resistance and the space charge was limited at high power. The open voltage (Voc) was equal to 800 mV, the short circuit current Jsc was equal to 430 µA, the fill factor (FF) was equal to 0.3 and the power out (Pout) was equal to 103 µW.

The data plotted in FIG. 8B illustrates that the photovoltaic devices similar to those describe above with reference to FIGS. 1 and 3 had a power out that is approximately 4 times the power out of the comparative device that provided the data in FIG. 8A. For the data plotted in FIG. 8B, the open voltage (Voc) was equal to 1.1 V, the short circuit current Jsc was equal to 605 µA, the fill factor (FF) was equal to 0.7 and the power out (Pout) was equal to 465 µW. The photovoltaic device that provided the data plotted in FIG. 8B also displayed no sign of saturation at the laser light equivalent to 150 Suns, and a power conversion efficiency of 33%.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$, where x is less than or equal to 1, etc. In addition, other elements can be included in the compound and still function in accordance with the present principles. The compounds with additional elements will be referred to herein as alloys.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A photovoltaic device comprising:
a p-n junction formed between an emitter layer and a base layer of first type III-V semiconductor material layers; and
a window layer of a second type III-V semiconductor material on the light receiving end of the p-n junction, the window layer of the photovoltaic device has a cross-sectional area of microscale, and the window layer having a thickness greater than a thickness of the base layer.

2. The photovoltaic device of claim 1, wherein the emitter layer includes a first gallium and arsenic containing layer doped to a first conductivity type that is in direct contact with the window layer; and the base layer formed on an opposite side of the emitter layer that is in contact with the window layer, the base layer including a second gallium and arsenic containing layer having a second conductivity type.

3. The photovoltaic device of claim 2, wherein the emitter layer has a nanoscale thickness, and the base layer has a microscale thickness.

4. The photovoltaic device of claim 1 further comprising electrodes of a type III-V semiconductor material on opposing ends of the window layer.

5. The photovoltaic device of claim 1 further comprising a supporting substrate that is present underlying the p-n junction, wherein the supporting substrate is separated from the base layer by a back surface field layer composed of indium gallium phosphide or aluminum gallium arsenide.

6. The photovoltaic device of claim 1 wherein the window layer is comprised of indium gallium phosphide or aluminum gallium arsenide having a thickness ranging from 500 nm to 5 microns.

7. The photovoltaic device of claim 1, wherein the photovoltaic device generates power ranging from the microwatt (μW) to milliwatt (mW) within a chip area of 100 μm×100 μm.

* * * * *